United States Patent
De Jonghe et al.

(10) Patent No.: US 6,911,280 B1
(45) Date of Patent: Jun. 28, 2005

(54) CHEMICAL PROTECTION OF A LITHIUM SURFACE

(75) Inventors: Lutgard De Jonghe, Lafayette, CA (US); Steven J. Visco, Berkeley, CA (US); Yevgeniy S. Nimon, Danville, CA (US); A. Mary Sukeshini, College Park, MD (US)

(73) Assignee: PolyPlus Battery Company, Berkeley, CA (US)

( * ) Notice: Subject to any disclaimer, the term of this patent is extended or adjusted under 35 U.S.C. 154(b) by 0 days.

(21) Appl. No.: 10/327,682

(22) Filed: Dec. 20, 2002

Related U.S. Application Data

(60) Provisional application No. 60/342,326, filed on Dec. 21, 2001.

(51) Int. Cl.[7] .................. H01M 2/08; H01M 10/04; H01M 10/26
(52) U.S. Cl. ............ 429/137; 429/246; 429/231.9; 429/231.95; 429/309; 429/319; 429/320; 429/321; 429/322; 429/126.1
(58) Field of Search .................. 429/137, 246, 429/231.9, 231.95, 309, 319, 320, 321, 322, 126.1

(56) References Cited

U.S. PATENT DOCUMENTS

| | | | | |
|---|---|---|---|---|
| 4,402,995 A | * | 9/1983 | Fleischer | 427/58 |
| 4,405,416 A | * | 9/1983 | Raistrick et al. | 205/407 |
| 5,314,765 A | * | 5/1994 | Bates | 429/231.95 |
| 6,025,094 A | * | 2/2000 | Visco et al. | 429/231.95 |
| 6,030,720 A | * | 2/2000 | Chu et al. | 429/105 |
| 6,068,950 A | | 5/2000 | Gan et al. | 429/231.9 |
| 6,096,447 A | | 8/2000 | Gan et al. | 429/3 |
| 6,200,701 B1 | | 3/2001 | Gan et al. | 429/203 |
| 6,203,942 B1 | | 3/2001 | Gan et al. | 429/203 |
| 6,274,269 B1 | | 8/2001 | Gan et al. | 429/215 |
| 6,280,598 B1 | * | 8/2001 | Barton et al. | 205/210 |
| 6,413,284 B1 | * | 7/2002 | Chu et al. | 29/623.1 |
| 6,489,055 B1 | | 12/2002 | Ichihashi et al. | 429/188 |
| 6,495,285 B2 | | 12/2002 | Gan et al. | 429/203 |
| 6,511,772 B2 | | 1/2003 | Gan et al. | 429/212 |
| 6,537,698 B2 | | 3/2003 | Gan et al. | 429/215 |
| 6,737,197 B2 | * | 5/2004 | Chu et al. | 429/218.1 |

\* cited by examiner

*Primary Examiner*—Hoa Van Le
(74) *Attorney, Agent, or Firm*—Beyer Weaver & Thomas LLP

(57) ABSTRACT

Disclosed are compositions and methods for alleviating the problem of reaction of lithium or other alkali or alkaline earth metals with incompatible processing and operating environments by creating a ionically conductive chemical protective layer on the lithium or other reactive metal surface. Such a chemically produced surface layer can protect lithium metal from reacting with oxygen, nitrogen or moisture in ambient atmosphere thereby allowing the lithium material to be handled outside of a controlled atmosphere, such as a dry room. Production processes involving lithium are thereby very considerably simplified. One example of such a process in the processing of lithium to form negative electrodes for lithium metal batteries.

60 Claims, 6 Drawing Sheets

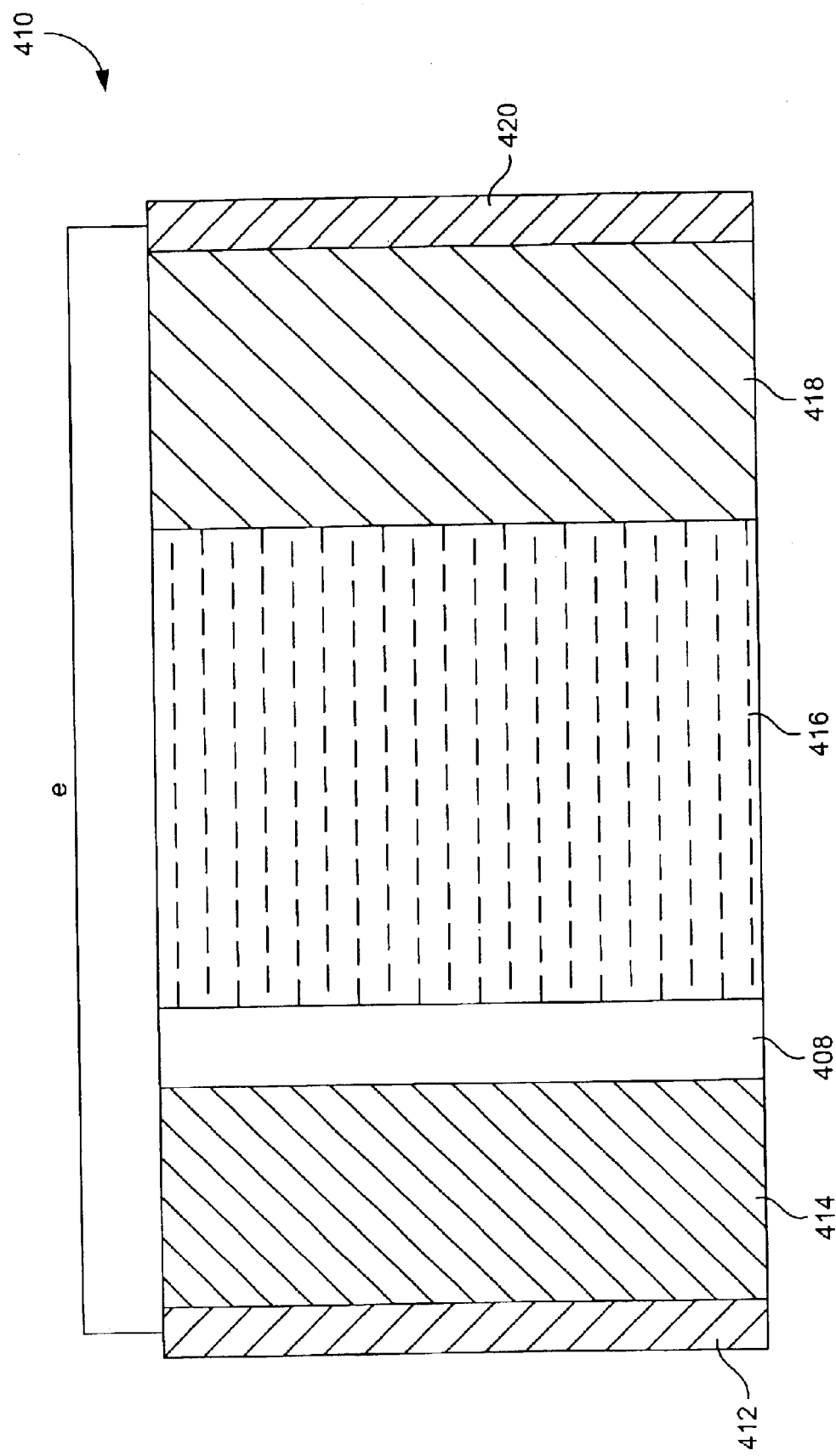

CHEMICAL PROTECTION OF A LITHIUM SURFACE

CROSS-REFERENCE TO RELATED APPLICATIONS

This application claims priority to U.S. Provisional Patent Application No. 60/342,326 filed Dec. 21, 2001, titled CHEMICAL PROTECTION OF A LITHIUM SURFACE. This provisional patent application is incorporated herein by reference for all purposes.

BACKGROUND OF THE INVENTION

1. Field of the Invention

The present invention relates generally to surface treatments to facilitate the processing of lithium (or other alkali) metal or alloys, such as for incorporation in electrochemical devices.

2. Description of Related Art

Lithium is an attractive material for use as an electrode component in electrochemical devices, such as batteries and capacitors, due to its very high energy density and low equivalent weight. However, lithium is highly reactive in ambient conditions and thus requires special handling during processing. Typically, lithium battery manufacture is conducted in inert environments in order to guard against degradation of lithium until it is hermetically sealed within a battery cell container.

Even with these precautions, lithium may detrimentally react with incompatible materials in the processing environment. For example, rechargeable lithium metal batteries have been prone to cell cycling problems. On repeated charge and discharge cycles, lithium "dendrites" have been found to gradually grow out from the lithium metal electrode, through the electrolyte, and ultimately contact the positive electrode. This causes an internal short circuit in the battery, rendering the battery unusable after a relatively few cycles. While cycling, lithium electrodes may also grow "mossy" deposits which can dislodge from the negative electrode and thereby reduce the battery's capacity. To address these problems, some researchers have proposed that the electrolyte facing side of the lithium negative electrode be coated with a "protective layer." Several methods may be envisioned for producing such a protective layer, but the processing methods by which such layers are produced may not be compatible with the lithium metal.

Some research has focused on "nitridation" of the lithium metal surface as a means for protecting lithium electrodes. In such process, a bare lithium metal electrode surface is reacted with a nitrogen plasma to form a surface layer of polycrystalline lithium nitride ($Li_3N$). This nitride layer conducts lithium ions and at least partially protects the bulk lithium of the negative electrode from a liquid electrolyte. A process for nitriding lithium battery electrodes it is described in R&D Magazine, September 1997, p. 65 (describing the work of S. A. Anders, M. Dickinson, and M. Rubin at Lawrence Berkeley National Laboratory). Unfortunately, in addition to structural and electrical problems with this approach, lithium nitride decomposes when exposed to moisture. While lithium metal batteries employ nonaqueous electrolytes, it is very difficult to remove all traces of moisture from the electrolyte. Thus, trace moisture will ultimately compromise the protective properties of the lithium nitride.

Other pre-formed lithium protective layers have been contemplated. Most notably, U.S. Pat. No. 5,314,765 (issued to Bates on May 24, 1994) describes a lithium electrode containing a thin layer of sputtered lithium phosphorus oxynitride ("LiPON") or related material. LiPON is a single ion (lithium ion) conducting glass. It is typically deposited by reactive sputtering of a lithium phosphate in the presence of nitrogen. The nitrogen, however, attacks the lithium surface, thereby making the process of direct deposition of the glass film impossible.

Other examples of potential protective layers may include the deposition of polymer layers that involve solvents or monomers that are incompatible with lithium.

Accordingly, it would facilitate handling of metallic lithium, lithium alloy or other alkali metal or metal alloys to provide an adequate surface protective layer. In particular fabrication processing and successful operation of alkali metals as battery electrodes would be enhanced by the provision of such a protective layer.

SUMMARY OF THE INVENTION

The present invention alleviates the problem of reaction of lithium or other alkali or alkaline earth metals with incompatible processing and operating environments by creating a ionically conductive chemical protective layer on the lithium or other reactive metal surface. Such a chemically produced surface layer can protect lithium metal from reacting with oxygen, nitrogen or moisture in ambient atmosphere thereby allowing the lithium material to be handled outside of a controlled atmosphere, such as a dry room. Production processes involving lithium are thereby very considerably simplified. One example of such a process is the processing of lithium to form negative electrodes for lithium metal batteries.

In one aspect, the invention relates to a composition comprising a lithium or other alkali or alkaline earth metal layer having a surface coated with a chemical protective layer, which protective layer is, at least transiently, physically and chemically stable in an ambient air environment and protects the lithium metal from further chemical reaction, which protective layer is covalently bonded to the metal surface, and which protective layer conducts ions of the metal. In a preferred embodiment, the metal layer is lithium or a lithium alloy and forms part of a negative battery electrode.

In another aspect, the invention relates to a method of providing a chemical protective layer on a surface of a lithium or other alkali or alkaline earth metal. The method includes introducing the lithium or other reactive metal into a reaction chamber, introducing one or more precursors of the protective layer into the reaction chamber and into contact with the metal, and conducting a reaction involving the one or more precursors to form the chemical protective layer on the metal surface, wherein the protective layer is, at least transiently, physically and chemically stable in an ambient air environment and protects the metal surface from further chemical reaction, the protective layer is covalently bonded to the surface, and the protective layer conducts ions of the metal.

In preferred embodiments, the chemical protective layer may be a phosphate or a carbonate. It may be formed by a liquid, vapor or gas phase surface treatment with a chemical precursor. It may be formed ex situ or in situ (for example, by incorporation of a protective layer-forming chemical precursor in an electrolyte) in a battery cell. Application of the chemical protective layer may be followed by application of a glassy protective layer, such as LiPON, and facilitates this process.

These and other features of the invention will further described below.

BRIEF DESCRIPTION OF THE DRAWINGS

FIG. 4 is a block diagram of a battery cell incorporating a chemically protected negative electrode in accordance with the present invention.

DETAILED DESCRIPTION OF SPECIFIC EMBODIMENTS

Figure 1:
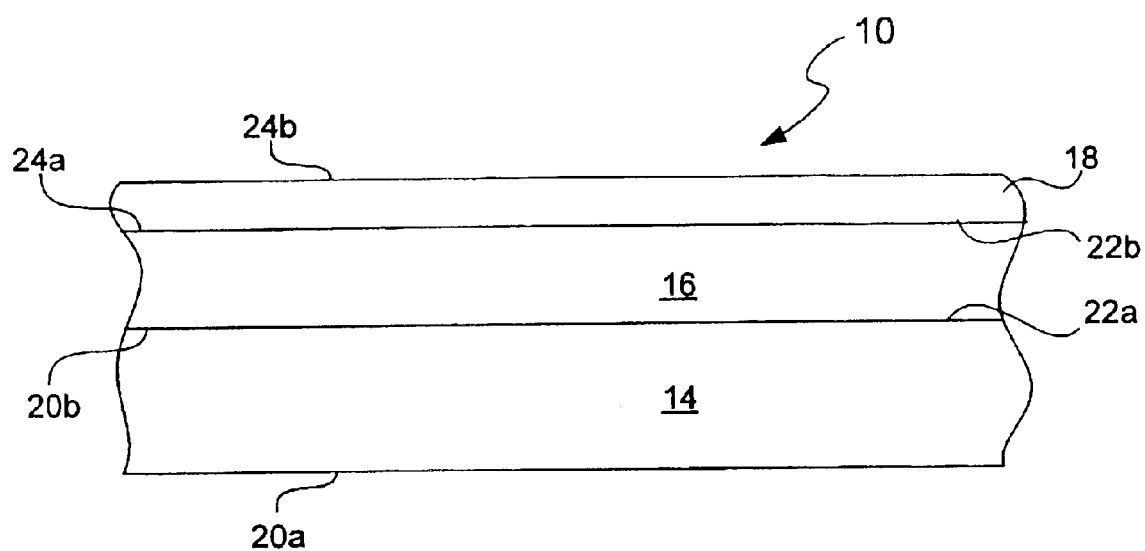
FIG. 1 is a block diagram of a lithium/liquid electrolyte/sulfur cell in accordance with one embodiment of this invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention alleviates the problem of reaction of lithium or other alkali or alkaline earth metals with incompatible processing and operating environments by creating a ionically conductive chemical protective layer on the lithium or other reactive metal surface. Such a chemically produced surface layer can protect lithium metal from reacting with oxygen, nitrogen or moisture in ambient atmosphere thereby allowing the lithium material to be handled outside of a controlled atmosphere, such as a dry room. Production processes involving lithium are thereby very considerably simplified. One example of such a process is the processing of lithium to form negative electrodes for lithium metal batteries.

The present invention will be described herein primarily with reference to a lithium metal battery electrode, a preferred embodiment. However, it should be understood that methods and compositions described may be equally applicable to other alkali metals (e.g., sodium and potassium) or alloys, or alkaline earth metals (e.g., calcium or magnesium) or alloys, as would be apparent to one of skill in the art. Also, the invention may be applicable more generally to lithium metal substrates used in other electrochemical or non-electrochemical devices or compositions.

Techniques and equipment for forming and coating lithium metal substrates, for example for use as negative battery electrodes, are known in the art and will not be further described here in order not to unnecessarily obscure the present invention. For example, U.S. Pat. No. 6,025,094, entitled PROTECTIVE COATINGS FOR NEGATIVE ELECTRODES, to Visco et al., incorporated by reference herein in its entirety and for all purposes, describes lithium metal battery electrode and cell fabrication techniques application to implement the present invention.

General Electrode Structure

In accordance with the present invention, the surface of a metallic negative electrode is modified to include a chemical protective layer on the electrolyte side. This protective layer should be at least transiently physically and chemically stable in an ambient air environment and protect the lithium metal from further chemical reaction, be covalently bonded to the first surface, and conduct lithium ions. The protective layer may be pre-formed (prior to battery fabrication) or formed in situ (e.g., incorporated in electrolyte). In the description that follows, the invention is described in terms of certain specific compositions, configurations, and processes to help explain how it may be practiced. The invention is not limited to these specific embodiments.

FIG. 1 illustrates a negative electrode 10 in accordance with this invention. Shown in cross-section, negative electrode 10 includes three components; a backing layer 14, a metal layer 16 and a chemical protective layer 18. The backing layer 14 includes a first surface 20a which is exposed to the ambient and a second surface 20b which intimately contacts the metal layer 16. Backing layer 14 will typically serve as a current collector. Metal layer 16 includes a first surface 22a which forms the interface with backing layer 14. It also includes a second surface 22b which intimately contacts protective layer 18. In turn, protective layer 18 includes a first surface 24a which contacts second surface 22b of metal layer 16. Finally, protective layer 18 includes a second surface 24b which is exposed to the ambient. The interfaces at surfaces 22a and 22b of metal layer 16 should be sufficiently continuous or intimate that moisture, air, electrolyte, and other agents from the ambient are prevented from contacting alkali metal 16. In addition, the interface at first surface 22a should provide a low resistance electronic contact between backing layer 14 and metal layer 16.

Backing layer 14 is provided on the side of negative electrode 10 which faces away from the electrolyte. It should be electronically conductive and unreactive to moisture, gases in the atmosphere (e.g., oxygen and carbon dioxide), electrolytes and other agents it is likely to encounter prior to, during, and after fabrication of a battery. In addition, backing material 14 should be compatible with the metal in layer 16 at potentials encountered in the battery. In this regard, the material in backing layer 18 should not easily migrate into or otherwise detrimentally effect the electrochemical properties of metal layer 16. Examples of suitable materials for backing layer 14 include foils or other thin metal layers of copper, stainless steel, nickel, zinc, chromium, and compatible alloys thereof. In addition, such metals may be provided as metallization layers on plastics such as polyethylene terephthalate (PET), polypropylene, polyethylene, polyvinylchloride (PVC), polyolefins, polyimides, etc.

In an alternative embodiment, conductive backing layer 14 is replaced with a non-electronically conductive outer layer such as a second protective layer. In this embodiment, a current collector or terminal must still be affixed to the alkali metal electrode. This may take the form of a metal tab or other electronically conductive member that extends beyond the protective layers.

Most generally, metal layer 16 can comprise any metal, any mixture of metal capable of functioning as a negative electrode. However, the protective layers of this invention will find most use in protecting highly reactive metals such as alkali metals and alkaline earth metals.

In one preferred embodiment, the materials for the negative electrodes include a metal such lithium or sodium or an alloy of one of these with one or more additional alkali metals (e.g., potassium) and/or alkaline earth metals (e.g., calcium and magnesium). Preferred alloys include lithium aluminum alloys, lithium silicon alloys, lithium tin alloys, and sodium lead alloys (e.g., $Na_4Pb$).

As indicated above, protective layer 18 should form a continuous and intimate interface with metal layer 16 to protect it from various agents in the environment. Unfortunately, most alkali metals are so reactive that very soon after they are produced in pure form, their surfaces react with any moisture, oxygen, and carbon dioxide in the environment. Even when handled in a dry box, lithium typically develops a thin layer of oxide, hydroxide, carbonate, etc. Unfortunately, such materials may hamper formation of a highly protective glass surface layer. As will be explained in more detail below, preferred processes of this invention form chemical protective layers.

Thereafter, other protective layers (e.g., inorganic ionically conductive glass, such as LiPON) may be formed directly on the chemically protected alkali metal surfaces immediately after the chemical protective layer is itself formed—possibly in a single vacuum chamber—or in a separate chamber—with the chemical protective layer providing protection to the metal surface during the intervening period.

Chemical Protective Layer Composition

Creation of a thin preferably between about 1 nm and 10 microns, more preferably between 10 nm and 1 micron, even more preferably between 50 nm and 0.1 micron, chemically protective layer on the lithium or other reactive metal surface helps to solve the problem of reaction of the metal surface with incompatible processing environment, in particular, in ambient conditions containing oxygen, nitrogen or moisture, or with gaseous nitrogen during direct deposition of a LiPON glass layer onto lithium by reactive sputtering of lithium phosphate.

The chemical protective layer 18 may be composed of any suitable material that reacts with lithium without degrading its surface (i.e., the reaction product does not block lithium ion transport) to form a coating that prevents further reaction. Particularly preferred examples include ionically conductive metal salts such as carbonates, phosphates, metaphosphates, phosphites, dithionates, fluorides, metasilicates and orthosilicates. In specified embodiments, lithium phosphate or lithium carbonate on lithium or lithium alloy surfaces are used.

Such coatings may be permanent or transient, depending on the quality of the lithium surface being coated. For example, a very high quality surface, that is, one that is flat and smooth, will support a longer lasting or permanent coating. A lower quality, rougher surface may only support a coating having a briefer lifetime. However, even a coating providing transient protection (e.g., a few hours or even minutes) may provide a significant advantage in handling and processing highly reactive materials such as lithium. For example, a coating that is effective long enough to move the substrate from one reaction chamber to another or through one or more process steps that would otherwise result in deleterious reaction of the lithium with components of the ambient or process environment is very advantageous.

Chemical protective coatings in accordance with the present invention should be applied in a controlled environment, free of materials that would react deleteriously with lithium, such as a processing chamber or glove box, as are well known to those of skill in the art. The coatings may be applied by reaction of the lithium with liquid, vapor or gas phase precursors. The use of vapor or gas phase precursors may be particularly advantageous to facilitate single chamber processing of lithium.

Figure 2:
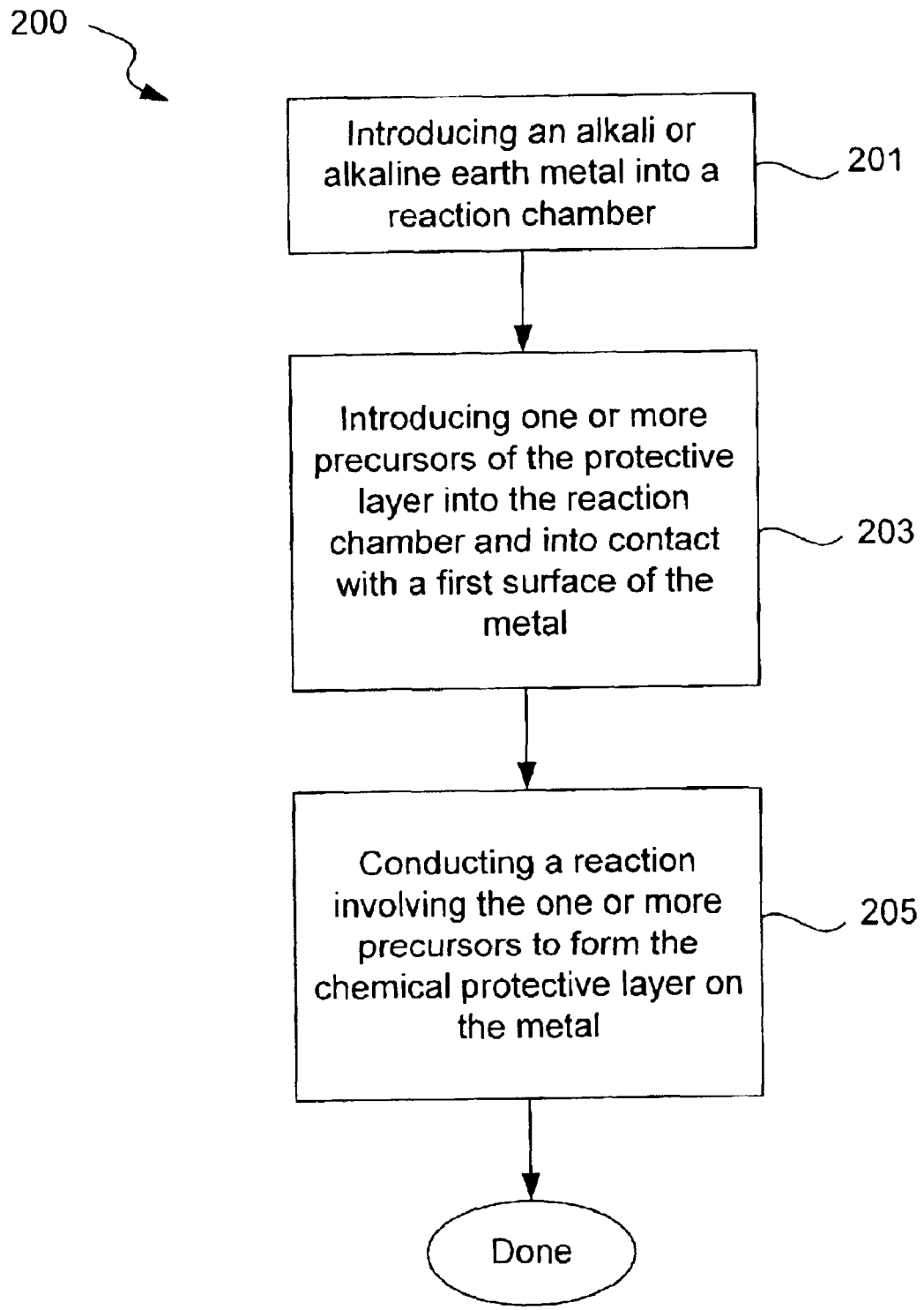
FIG. 2 is a process flow diagram of a method of providing a chemical protective layer on a metal in accordance with a specific embodiment of the present invention.

Referring to the flow chart of FIG. 2, a method 200 of providing a chemical protective layer on a metal in accordance with a specific embodiment of the present invention is illustrated and described. An alkali or alkaline earth metal is introduced into a reaction chamber (201). Then, one or more precursors of the protective layer are introduced into the reaction chamber and into contact with a first surface of the metal (203). A reaction involving the one or more precursors and the metal is conducted to form the chemical protective layer on the metal surface (205). The protective layer is ionically conductive and is covalently bonded to the metal surface. It is physically and chemically stable in an ambient air or processing environment so that it protects the metal from further chemical reaction with the ambient air environment.

Protective layer precursors may be contacted with reactive metal surfaces in liquid, vapor or gas phase according to various techniques such as are well known in the art.

In one specific embodiment, a layer of lithium phosphate may be formed chemically by bringing the lithium surface into contact with anhydrous phosphoric acid in a suitable organic solvent. Examples of organic solvents suitable for incorporation of phosphate forming additives such as anhydrous phosphoric acid, are DME, various glymes (e.g., mono-, di- and tri-glymes), ether, and other compatible aprotic solvents, such as THF, commonly know in the field. Concentrations of anhydrous phosphate forming additives may range from 5 ppm to 30 vol % of the solvent.

Alternatively, a layer of phosphate may be formed by vapor-based processes such as sputtering or electron beam deposition, organometallic methods, sol-gel methods, or any other methods such as commonly known for forming thin layers on surfaces, such as described further below. In other embodiments, a layer of lithium carbonate may be formed by bringing the lithium metal surface into contact with gaseous $CO_2$, $CO_2$ and $O_2$ mixtures, or liquid organic carbonates, in particular, alkyl carbonates (propylene carbonate, ethylene carbonate, dimethyl carbonate, diethyl carbonate, ethyl methyl carbonate, and others).

Other possible protective layers include lithium metaphosphate ($LiPO_3$), lithium dithionate ($Li_2S_2O_4$), lithium fluoride (LiF), lithium metasilicate ($Li_2SiO_3$), and Lithium orthosilicate ($Li_2SiO_4$), which could be reacted with the lithium (or other) metal surface in the acid form, (e.g., HF+lithium metal=lithium metal-LiF+$H_2$ evolution).

A variety of processes may be used to form a chemical protective layer on an active metal (e.g., lithium) surface in accordance with the present invention. These include:

Vapor phase processes, in which a gas (e.g., $CO_2$ or $SO_2$ (plus small amount of $O_2$)) is introduced into a chamber containing a lithium metal foil. The lithium surface reacts with the $CO_2$ to form $Li_2CO_3$, or with $SO_2$ to form $Li_2SO_4$ or $Li_2S_2O_4$. For a phosphorus-based film, red phosphorus may be sublimed in the presence of oxygen to form lithium phosphate on the surface of the lithium;

Organometallic processes in which an organic molecule containing phosphorus, sulfur, fluorine, etc. are dissolved in an organic solvent. The solution is contacted with lithium in a suitable processing environment and allowed to react with the lithium to form LiF, $Li_3PO_4$, $Li_2SO_4$, etc. (e.g., $MeO_3P+Li \rightarrow Li_3PO_4+MeOH$);

Sol-gel processes in which a glass and/or ceramic precursor dissolved in an organic solvent, such as tetraethylorthosilicate (TEOS) in DME, is aerosol-sprayed, dip-coated, or spun onto a lithium surface, allowing reaction with the lithium surface to form an ionically conductive lithium silicate glass (e.g., $Li_4SiO_4$);

Sputtering processes in which a protective layer precursor is sputtered onto to a lithium surface in an inert sputtering environment, such as provided by pure argon, to form the protective layer (e.g., $Li_3PO_4$ or LF); and Electron beam processes in which an e-beam is used to evaporate a protective layer precursor to form the protective layer (e.g., $Li_3PO_4$ or LF).

Figure 3:
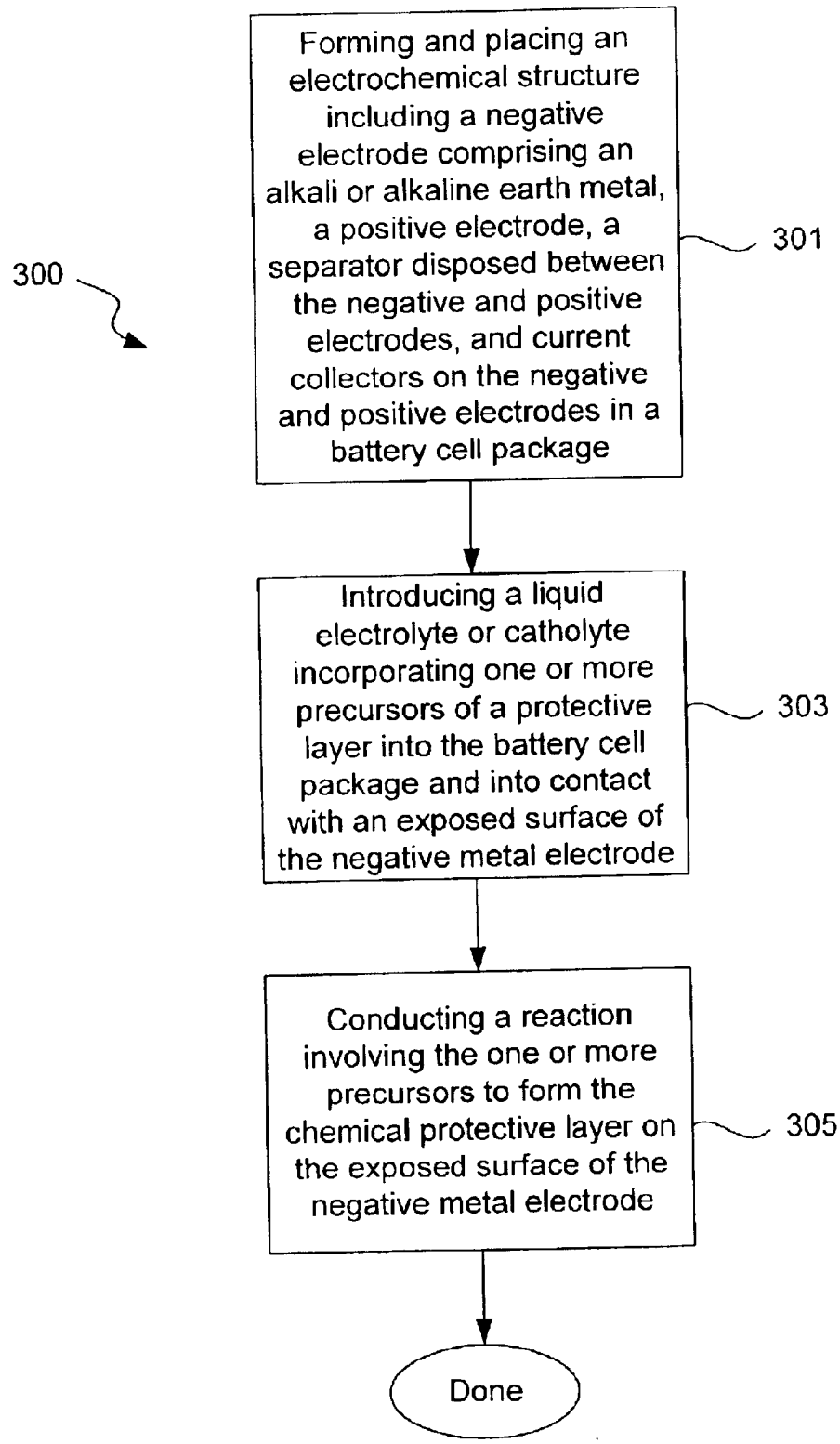
FIG. 3 is a process flow diagram of an in situ method of providing a chemical protective layer on a metal in accordance with a specific embodiment of the present invention.

Further, as noted above, protection of the lithium (or other metal) surface may also be improved by incorporation of a chemical protective layer precursor (e.g., phosphoric acid) directly into the electrolyte or catholyte of a lithium anode battery, for example in an amount of about 5 ppm-30 vol. %, preferably from 5 ppm to 5000 ppm, more preferably form 100 to 3000 ppm, even more preferably from 500 to 2000 ppm. Referring to FIG. 3, a method 300 of providing a chemical protective layer on a negative metal electrode is illustrated and described. An electrochemical structure including a negative electrode comprising an alkali or alkaline earth metal, a positive electrode, a separator disposed between the negative and positive electrodes, and current collectors on the negative and positive electrodes is formed and placed in a battery cell package (301). A liquid electrolyte or catholyte incorporating one or more precursors of a protective layer is introduced into the battery cell package and into contact with an exposed surface of the negative metal electrode (303). Then a reaction is conducted involving the one or more precursors to form the chemical protective layer on the exposed surface of the negative metal electrode (305).

In situ protection in batteries and related electrochemical devices of the preformed protective surface layer may be further enhanced by incorporating such precursors in the electrolyte of such battery or device.

Glassy Protective Layer

Where the invention is implemented as a negative electrode for a lithium (or other alkali) metal battery it may be desirable to provide a further physical protective coating on the electrode. As noted above, the chemical protective layer of the present invention advantageously provides protection for the lithium from deleterious reactions with incompatible processing environments (for example, ambient air atmospheres containing oxygen, nitrogen (particularly in the case of LiPON deposition) or moisture) by creating a chemical protective layer on the lithium metal surface. This allows the lithium material to be handled outside of a controlled atmosphere, such as a dry room, facilitating application of a physical protective layer, such as a glass or amorphous material that is conductive to alkali metal ions of the alkali metal comprising layer 16. Examples of such glassy protective layer materials are provided in U.S. Pat. No. 6,025,094, previously incorporated by reference. Preferred types of inorganic ionically conductive glass include phosphorus-based glass, oxide-based glass, sulphur-based glass, oxide/sulfide based glass, selenide based glass, gallium based glass, germanium based glass, and glass-ceramic active metal ion conductors, sodium beta-alumina or lithium beta-alumina. Examples of suitable ionically conductive protective glasses include lithium phosphorus oxynitride (LiPON), $Li_3PO_4.Li_2S.SiS_2$, $Li_2S.GeS_2.Ga_2S_3$ and $Li_{1-x-y}Al_xTi_{2-x}Si_yP_{3-y}O_{12}$, LISICON, NASICON, sodium and lithium beta-alumina. These protective glasses may also act as a solid electrolyte where the metal is used as a negative electrode in a battery cell. Such an electrode may also alternatively be combined with a solid polymer electrolyte.

As noted above, it is further contemplated that chemical protective layer precursors may be incorporated in the electrolytes of battery cells having negative alkali metal electrodes with glassy protective layers, such as LiPON. The presence of such precursors allows for the formation of a "healing" chemical protective layer in the event of a crack or other defect or damage to the glassy protective layer.

Battery Cells

Referring now to FIG. 4, a battery cell 400 incorporating a chemically protected negative electrode, in accordance with a preferred embodiment of the present invention is shown. Cell 400 includes a negative current collector 412 which is formed of an electronically conductive material. The current collector serves to conduct electrons between a cell terminal (not shown) and a negative electrode 414 to which current collector 412 is affixed. Negative electrode 414 is made from lithium or other similarly active metal alloy material, and includes a chemical protective layer 408 formed opposite current collector 412. Protective layer 408 contacts an electrolyte in an electrolyte region 416. As mentioned, the electrolyte may be liquid, gel, or solid (e.g., polymer). To simplify the discussion of FIG. 4, the electrolyte will be referred to as "liquid electrolyte" or just "electrolyte." An example of a solid electrolyte is polyethylene oxide. An example of gel electrode is polyethylene oxide containing a significant quantity of entrained liquid such as an aprotic solvent.

An optional separator in region 416 prevents electronic contact between the positive and negative electrodes. A positive electrode 418 abuts the side of separator layer 416 opposite negative electrode 414. As electrolyte region 416 is an electronic insulator and an ionic conductor, positive electrode 418 is ionically coupled to but electronically insulated from negative electrode 414. Finally, the side of positive electrode 418 opposite electrolyte region 416 is affixed to a positive current collector 420. Current collector 420 provides an electronic connection between a positive cell terminal (not shown) and positive electrode 418.

Current collector 420, which provides the current connection to the positive electrode, should resist degradation in the electrochemical environment of the cell and should remain substantially unchanged during discharge and charge. In one embodiment, the current collectors are sheets of conductive material such as aluminum or stainless steel.

The positive electrode may be attached to the current collector by directly forming it on the current collector or by pressing a pre-formed electrode onto the current collector. Positive electrode mixtures formed directly onto current collectors preferably have good adhesion. Positive electrode films can also be cast or pressed onto expanded metal sheets. Alternately, metal leads can be attached to the positive electrode by crimp-sealing, metal spraying, sputtering or other techniques known to those skilled in the art. Some positive electrode can be pressed together with the electrolyte separator sandwiched between the electrodes. In order to provide good electrical conductivity between the positive electrode and a metal container, an electronically conductive matrix of, for example, carbon or aluminum powders or fibers or metal mesh may be used.

A separator may occupy all or some part of electrolyte compartment 416. Preferably, it will be a highly porous/permeable material such as a felt, paper, or microporous plastic film. It should also resist attack by the electrolyte and other cell components under the potentials experienced within the cell. Examples of suitable separators include glass, plastic, ceramic, and porous membranes thereof among other separators known to those in the art. In one specific embodiment, the separator is Celgard 2300 or Celgard 2400 available from Hoechst Celanese of Dallas, Tex.

In an alternative embodiment, no separator is employed and a solid electrolyte or glassy protective layer, such as LiPON, on the negative electrode prevents the positive and negative electrodes from contacting one another and serves the function of a separator. In such cases, the protective layer should be tough. It may be relatively thick and made from a material that resists cracking and abrasion.

In some embodiments of the invention, the cell may be characterized as a "thin film" or "thin layer" cell. Such cells possess relatively thin electrodes and electrolyte separators. Preferably, the positive electrode is no thicker than about 300 $\mu$m, more preferably no thicker than about 150 $\mu$m, and most preferably no thicker than about 100 $\mu$m. The negative electrode preferably is no thicker than about 100 $\mu$m and more preferably no thicker than about 100 $\mu$m. Finally, the electrolyte separator (when in a fully assembled cell) is no thicker than about 100 $\mu$m and more preferably no thicker than about 40 $\mu$m.

Lithium-Sulfur Batteries

Sulfur positive electrodes and metal-sulfur batteries are described in U.S. Pat. No. 5,686,201 issued to Chu on Nov. 11, 1997 and U.S. patent application Ser. No. 08/948,969 naming Chu et al. as inventors, filed on Oct. 10, 1997. Both of these documents are incorporated by reference for all purposes. The sulfur positive electrodes preferably include in their theoretically fully charged state sulfur and an electronically conductive material. At some state of discharge, the positive electrode will include one or more polysulfides and possibly sulfides, which are polysulfides and sulfides of the metal or metals found in the negative electrode. In some embodiments, the fully charged electrode may also include some amount of such sulfides and/or polysulfides.

The positive electrode is fabricated such that it permits electrons to easily move between the sulfur and the electronically conductive material, and permits ions to move between the electrolyte and the sulfur. Thus, high sulfur utilization is realized, even after many cycles. If the lithium-sulfur battery employs a solid or gel state electrolyte, the positive electrode should include an electronic conductor (e.g., carbon) and an ionic conductor (e.g., polyethylene oxide) in addition to the sulfur electroactive material. If the battery employs a liquid electrolyte, the positive electrode may require only an electronic conductor in addition to the sulfur electroactive material. The electrolyte itself permeates the electrode and acts as the ionic conductor. In the case of a liquid electrolyte cell, the battery design may assume two formats: (1) all active sulfur (elemental sulfur, polysulfides and sulfides of the positive electrode) is dissolved in electrolyte solution (one phase positive electrode) and (2) the active sulfur is distributed between a solid phase (sometimes precipitated) and a liquid phase.

When the lithium-sulfur battery cells in accordance with this invention include a liquid electrolyte, that electrolyte should keep many or all of sulfur discharge products in solution and therefore available for electrochemical reaction. Thus, they preferably solubilize lithium sulfide and relatively low molecular weight polysulfides. In a particularly preferred embodiment, the electrolyte solvent has repeating ethoxy units ($CH_2CH_2O$). This may be a glyme or related compound. Such solvents are believed to strongly coordinate lithium and thereby increase the solubility of discharge products of lithium-sulfur batteries. Suitable liquid electrolyte solvents are described in more detail in U.S. patent application Ser. No. 08/948,969, previously incorporated by reference.

It should be understood that the electrolyte solvents of this invention may also include cosolvents. Examples of such additional cosolvents include sulfolane, dimethyl sulfone, dialkyl carbonates, tetrahydrofuran (THF), dioxolane, propylene carbonate (PC), ethylene carbonate (EC), dimethyl carbonate (DMC), butyrolactone, N-methylpyrrolidinone, dimethoxyethane (DME or glyme), hexamethylphosphoramide, pyridine, N,N-diethylacetamide, N,N-diethylformamide, dimethylsulfoxide, tetramethylurea, N,N-dimethylacetamide, N,N-dimethylformamide, tributylphosphate, trimethylphosphate, N,N,N',N'-tetraethylsulfamide, tetraethylenediamine, tetramethylpropylenediamine, pentamethyldiethylenetriamine, methanol, ethylene glycol, polyethylene glycol, nitromethane, trifluoroacetic acid, trifluoromethanesulfonic acid, sulfur, dioxide, boron trifluoride, and combinations of such liquids.

The protective layers employed in this invention may allow the use of electrolyte solvents that work well with sulfides and polysulfides but may attack lithium. Examples of solvents in this category include amine solvents such as diethyl amine, ethylene diamine, tributyl amine, amides such as dimethyl acetamide and hexamethyl phosphoramide (HMPA), etc.

Exemplary but optional electrolyte salts for the battery cells incorporating the electrolyte solvents of this invention include, for example, lithium trifluoromethanesulfonimide ($LiN(CF_3SO_2)_2$), lithium triflate ($LiCF_3SO_3$), lithium perchlorate ($LiClO_4$), $LiPF_6$, $LiBF_4$, and $LiAsF_6$, as well as corresponding salts depending on the choice of metal for the negative electrode, for example, the corresponding sodium salts. As indicated above, the electrolyte salt is optional for the battery cells of this invention, in that upon discharge of the battery, the metal sulfides or polysulfides formed can act as electrolyte salts, for example, $M_{x/z}S$ wherein x=0 to 2 and z is the valence of the metal.

As mentioned, the battery cells of this invention may include a solid-state electrolyte. An exemplary solid-state electrolyte separator is a ceramic or glass electrolyte separator which contains essentially no liquid. Specific examples of solid-state ceramic electrolyte separators include beta alumina-type materials such as sodium beta alumina, Nasicon™ or Lisicon™ glass or ceramic. Polymeric electrolytes, porous membranes, or combinations thereof are exemplary of a type of electrolyte separator to which an aprotic organic plasticizer liquid can be added according to this invention for the formation of a solid-state electrolyte separator generally containing less than 20% liquid. Suitable polymeric electrolytes include polyethers, polyimines, polythioethers, polyphosphazenes, polymer blends, and the like and mixtures and copolymers thereof in which an appropriate electrolyte salt has optionally been added. Preferred polyethers are polyalkylene oxides, more preferably, polyethylene oxide.

In the gel-state, the electrolyte separator generally contains at least 20% (weight percentage) of an organic liquid (see the above listed liquid electrolytes for examples), with the liquid being immobilized by the inclusion of a gelling agent. Many gelling agents such as polyacrylonitrile, polyvinylidene difluoride (PVDF), or polyethylene oxide (PEO), can be used.

It should be understood that some systems employing liquid electrolytes are commonly referred to as having "polymer" separator membranes. Such systems are considered liquid electrolyte systems within the context of this invention. The membrane separators employed in these systems actually serve to hold liquid electrolyte in small pores by capillary action. Essentially, a porous or microporous network provides a region for entraining liquid electrolyte. Such separators are described in U.S. Pat. No. 3,351,495 assigned to W.R. Grace & Co. and U.S. Pat. Nos. 5,460,904, 5,540,741, and 5,607,485 all assigned to Bellcore, for example. Each of these patents is incorporated herein by reference for all purposes.

The fully charged state of some cells of this invention need not require that the positive electrode be entirely converted to elemental sulfur. It may be possible in some cases to have the positive electrode be a highly oxidized form of lithium polysulfide, for example, as in $Li_2S_x$ where x is five or greater. The fully charged positive electrode may also include a mixture of such polysulfides together with elemental sulfur and possibly even some sulfide. It should be understood that during charge, the positive electrode would generally not be of uniform composition. That is, there will be some amount of sulfide, sulfur, and an assortment of polysulfides with various values of x. Also, while the electrochemically active material includes some substantial fraction of "sulfur," this does not mean that the positive electrode must rely exclusively upon sulfur for its electrochemical energy.

The electronic conductor in the positive electrode preferably forms an interconnected matrix so that there is always a clear current path from the positive current collector to any position in the electronic conductor. This provides high availability of electroactive sites and maintained accessibility to charge carriers over repeated cycling. Often such electronic conductors will be fibrous materials such as a felt or paper. Examples of suitable materials include a carbon paper from Lydall Technical Papers Corporation of Rochester, N.H. and a graphite felt available from Electrosynthesis Company of Lancaster, N.Y.

The sulfur is preferably uniformly dispersed in a composite matrix containing an electronically conductive material. Preferred weight ratios of sulfur to electronic conductor in the sulfur-based positive electrodes of this invention in a fully charged state are at most about 50:1, more preferably at most about 10:1, and most preferably at most about 5:1. The sulfur considered in these ratios includes both precipitated or solid phase sulfur as well as sulfur dissolved in the electrolyte. Preferably, the per weight ratio of electronic conductor to binder is at least about 1:1 and more preferably at least about 2:1.

The composite sulfur-based positive electrode may further optionally include performance enhancing additives such as binders, electrocatalysts (e.g., phthalocyanines, metallocenes, brilliant yellow (Reg. No. 3051-11-4 from Aldrich Catalog Handbook of Fine Chemicals; Aldrich Chemical Company, Inc., 1001 West Saint Paul Avenue, Milwaukee, Wis.) among other electrocatalysts), surfactants, dispersants (for example, to improve the homogeneity of the electrode's ingredients), and protective layer forming additives to protect a lithium negative electrode (e.g., organosulfur compounds, phosphates, iodides, iodine, metal sulfides, nitrides, and fluorides). Preferred binders (1) do not swell in the liquid electrolyte and (2) allow partial but not complete wetting of the sulfur by the liquid electrolyte. Examples of suitable binders include Kynar available from Elf Atochem of Philadelphia, Pa., polytetrafluoroethylene dispersions, and polyethylene oxide (of about 900 k molecular weight for example). Other additives include electroactive organodisulfide compounds employing a disulfide bond in the compound's backbone. Electrochemical energy is generated by reversibly breaking the disulfide bonds in the compound's backbone. During charge, the disulfide bonds are reformed. Examples of organodisulfide compounds suitable for use with this invention are presented in U.S. Pat. Nos. 4,833,048 and 4,917,974 issued to De Jonghe et al. and U.S. Pat. No. 5,162,175 issued to Visco et al.

EXAMPLES

Various experiments were conducted to demonstrate the advantages provided by the various aspects of this invention. The examples presented here are intended to better illustrate the invention as described herein and are non-limiting.

Example 1

Production of Protective Lithium Phosphate Film by Li Surface Treatment with Phosphoric Acid The Li electrode surface (125 micron foil from Cyprus Foote) was treated with dry DME containing anhydrous phosphoric acid (1500 ppm) for a treatment time of 45 seconds. Surface treatment was conducted by coating of the Li foil pressed onto SS current collector with this solution followed by DME evaporation. About 1.0 ml of the solution was put on Li surface. After Li reaction with phosphoric acid and formation of lithium phosphate layer on the Li surface, DME was allowed to evaporate at room temperature. Residual unreacted phosphoric acid on the surface was rinsed out by a large volume of DME. In some experiments before treatment with phosphoric acid Li surface was polished with Tyvek fabric (1509 B). All described operations were conducted in an argon-filled glove box.

Figure 5A:
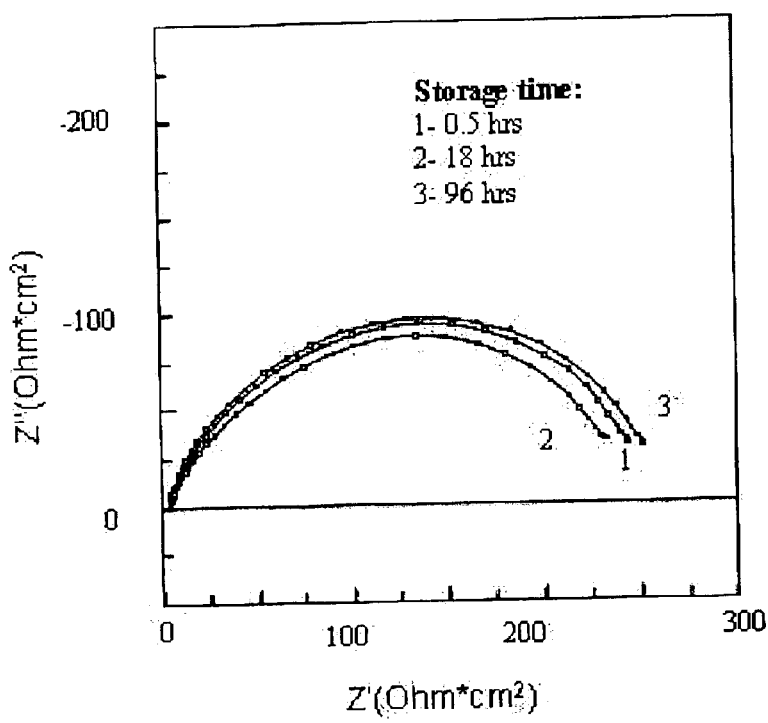
FIG. 5A is a graph of impedance at the interface between a Li electrode chemically protected with a lithium phosphate-based film and a solution of 0.5 M LiTFSI in a mixture of DME and 1,3-Dioxolane (9:1) measured after different storage durations.
Figure 5B:
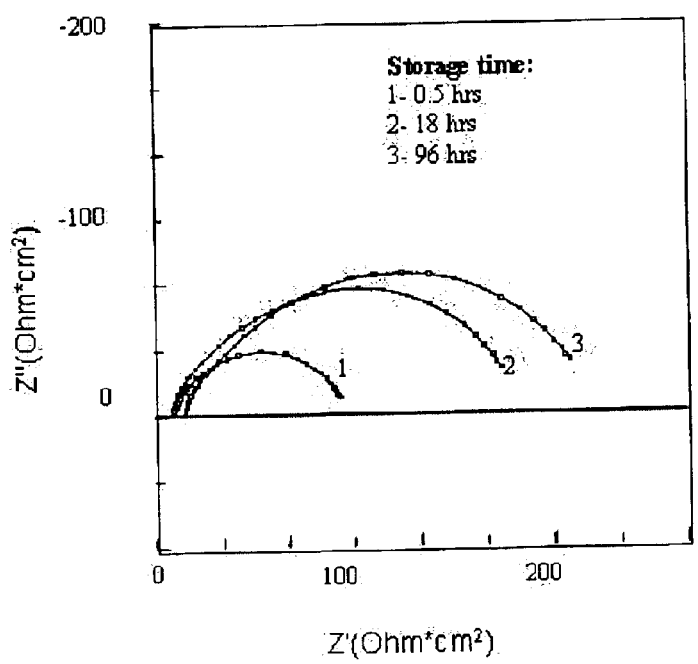
FIG. 5B is a graph of impedance at the interface between an untreated (standard) Li electrode and the solution of 0.5 M LiTFSI salt in the mixture of DME and 1,3-Dioxolane (9:1) measured after different storage durations.

Electrochemical cells containing a Li electrode coated with a lithium phosphate chemical protective underlayer were assembled and tested. The impedance of the interface between the Li electrode and a solution of 0.5 M LiTFSI in the mixture of DME and 1,3-Dioxolane (9:1) was measured after different storage periods. As can be seen from FIG. 5A, the electrode pretreated with phosphoric acid exhibited relatively small and stable impedance. At the same time the interface impedance for cells having an untreated Li electrode grew rapidly during storage. (FIG. 5B) This indicates that the formed lithium phosphate surface layer can protect the Li electrode from reacting with the active components of the electrolyte.

Example 2

Production of Protective Lithium Phosphate Underlayer by Li Surface Treatment with Phosphoric Acid The Li electrode surface (125 μm foil from Cyprus Foote) was treated with dry DME containing anhydrous phosphoric acid as described in Example 1. After the pre-treatment Li foil was transferred to the sputtering chamber for reactive RF sputtering of LiPON glass layer using lithium phosphate target of 8 inch diameter in the presence of nitrogen. RF power was 100 W, and duration of sputtering was about 1.5 hrs. No evidence of reaction between nitrogen and Li and formation of black lithium nitride reaction product was observed and the LiPON layer was successfully deposited onto Li surface. In experiments where described Li pre-treatment with acid was not used, the Li surface was attacked with nitrogen and almost immediately covered with black lithium nitride film. Therefore, Li chemical treatment with phosphoric acid creates a protective underlayer that allows for direct reactive sputtering of LiPON onto Li.

Figure 6:
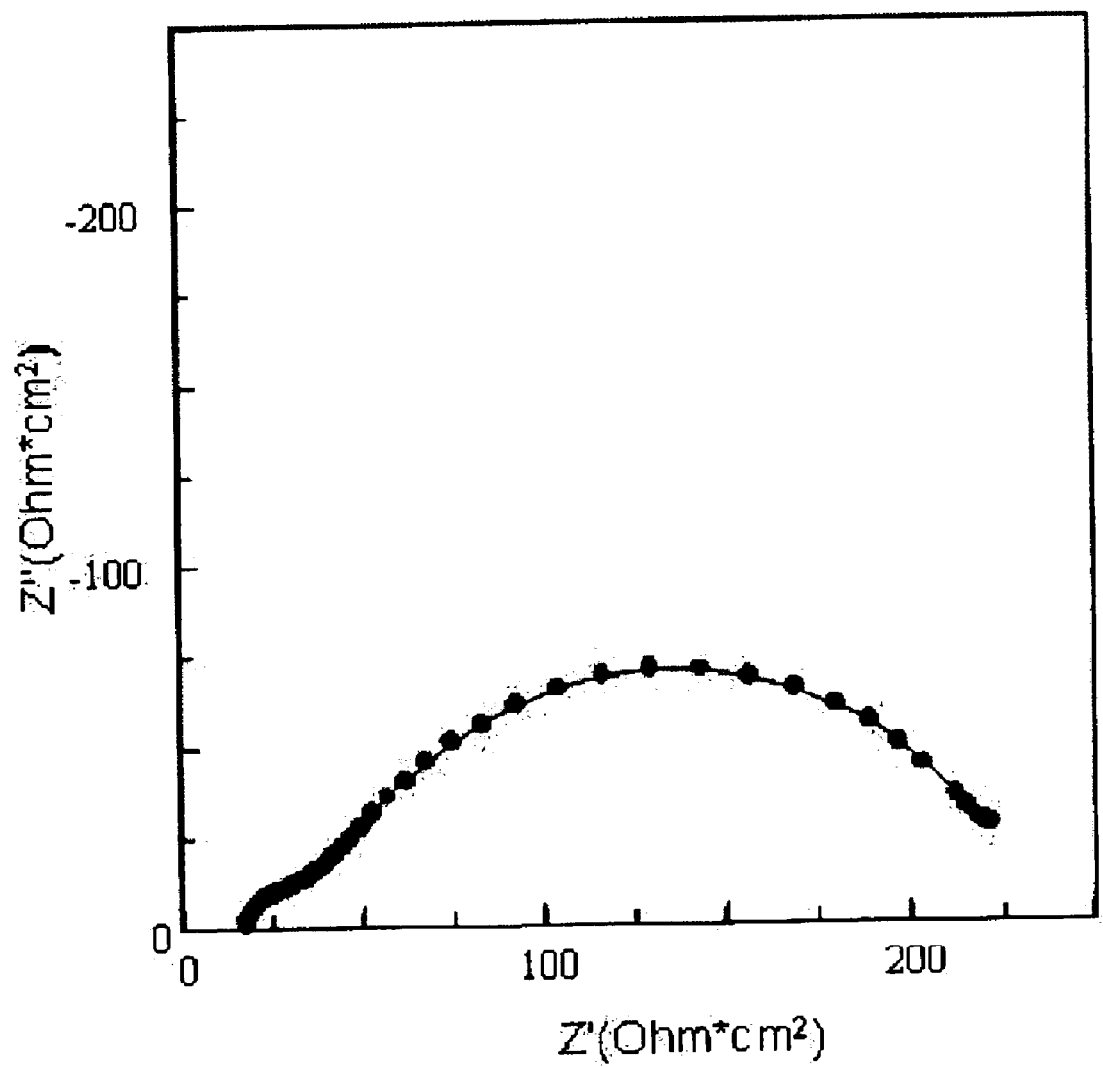
FIG. 6 is a graph of impedance at the interface between a Li electrode chemically protected with a lithium phosphate-based film and directly coated with LiPON and a solution of 10 M sulfur as $Li_2S_8$, 0.5 M LiTFSI dissolved in a mixture of DME and 1,3-Dioxolane (9:1).

Li/C electrochemical cells containing a Li electrode coated with a lithium phosphate underlayer and the LiPON film produced as described above were assembled and tested. The impedance of the interface between the Li electrode and 10 M sulfur as $Li_2S_8$ dissolved in a mixture of DME and 1,3-Dioxolane (9:1) was measured after different periods of storage. As can be seen from FIG. 6, the electrode pretreated with phosphoric acid and coated with lithium phosphate before LiPON sputtering exhibits relatively low resistance of about 225–250 Ohm*$cm^2$. After cell storage the interface resistance was practically the same as for the freshly made cell. This indicates that the formed surface film can protect the Li electrode from reacting with the dissolved lithium polysulfides.

Example 3

Production of Protective Lithium Phosphate Underlayer by Sputtering of Lithium Phosphate onto Li Surface The Li electrode (125 micron foil from Cyprus Foote) was transferred to the sputtering chamber and lithium phosphate was sputtered onto the Li surface. Sputtering was conducted in an atmosphere of pure Ar at RF power 100 W. After about 1 hr of sputtering, nitrogen was introduced into the chamber and the LiPON layer about 0.1 micron thick was sputtered onto the Li surface. No evidence of reaction between nitrogen and Li and formation of black lithium nitride reaction product was observed. This demonstrates that Li surface coating with dense lithium phosphate underlayer protects Li surface from nitrogen attack and allows for direct LiPON sputtering onto Li.

Example 4

Production of Protective Lithium Phosphate Underlayer by Combination of Li Surface Treatment with Phosphoric Acid and Sputtering of Lithium Phosphate onto Li Surface The Li electrode surface (125 μm foil from Cyprus Foote) was treated with dry DME containing anhydrous phosphoric acid as described in Example 1, then the Li electrode was transferred to the sputtering chamber and lithium phosphate was sputtered onto the Li surface in an atmosphere of pure Ar exactly as described in Example 3. After that Ar was replaced with nitrogen in the sputtering chamber and the LiPON layer about 0.1 micron thick was sputtered onto the Li surface at 100 W. No evidence of reaction between nitrogen and Li and formation of lithium nitride was observed, except for the edges of the Li foil that became black. These edges were coated with the tape and were not exposed during Li treatment with DME containing anhydrous phosphoric acid. As a result, nitrogen reacted with Li along the edges during lithium phosphate sputtering in nitrogen atmosphere.

Example 5

Incorporation of Phosphoric Acid into the Battery's Catholyte

The desired catholytes were prepared by addition of appropriate amounts (500 and 1500 ppm) of anhydrous phosphoric acid to the solution of 10 M sulfur as $Li_2S_8$ in the mixture of DME and 1,3-Dioxolane (9:1). It was shown that the presence of phosphoric acid did not affect the intrinsic stability of the electrolyte system. In particular it did not initiate polymerization of Dioxolane.

Li/C electrochemical cells containing plain Li electrode and the catholytes with and without phosphoric acid were assembled and tested. It was found that the interface impedance for the cells with phosphoric acid additives was small and stable. At the same time the interface impedance for the cells without these additives grew rapidly during storage. This shows that protection of Li surface can be improved by incorporation of phosphoric acid that can react with Li surface forming a protective layer based on lithium phosphate. In the case of Li electrodes coated with the LiPON layer, phosphoric acid may effectively heal cracks which form in the glassy layer during cycling.

Example 6

Producing Protective Lithium Carbonate Underlayer by Li Surface Treatment with $CO_2$ The Li electrode surface (125 μm foil from Cyprus Foote pressed onto SS current collector) was treated with dry gaseous $CO_2$ (99.99% purity from Matheson Tri-Gas Inc.). Surface treatment was conducted in the specially designed SS reactor. This reactor was loaded with the Li electrodes in the Ar-filled dry box, hermetically sealed, and taken out of the box. The Li electrode surface was treated with $CO_2$ by passing the gas through the reactor for about 30 minutes. During this treatment positive pressure of about 15 psi was maintained inside the reactor. After Li reaction with $CO_2$ and formation of lithium carbonate layer on the Li surface, the Li electrodes were transferred to the sputtering chamber. Reactive RF sputtering of LiPON glass layer was performed in the presence of nitrogen by use lithium phosphate target of 8 inch diameter. RF power was 200 W, and duration of sputtering was about 13 hrs. The Li substrates were rotated during sputtering in order to improve uniformity of the LiPON coating. No evidence of reaction between nitrogen and Li and formation of black lithium nitride reaction product was observed and the LiPON layer was successfully deposited onto Li surface. In experiments where described Li pre-treatment with $CO_2$ was not used, the Li surface was attacked with nitrogen and almost immediately covered with black lithium nitride film. Therefore, Li chemical treatment with gaseous $CO_2$ creates a protective underlayer that allows for direct reactive sputtering of LiPON onto Li.

Conclusion

The chemically protected metal electrodes of the present invention have the advantage that they can be handled in ambient atmosphere without deterioration of the metal electrode surface, and can have additional films deposited onto them in atmospheres that would typically attack the metal surface if it were not for the protective film described herein.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention is primarily described with reference to lithium, the chemical protective coatings of the present invention may also advantageously be applied to other alkali metals (e.g., sodium and potassium) and alloys or to alkaline earth metals (e.g., calcium and magnesium) or alloys. Accordingly, the present embodiments are to be considered as illustrative and not restrictive, and the invention is not to be limited to the details given herein, but may be modified within the scope and equivalents of the appended claims.

All references cited herein are incorporated by reference for all purposes.

What is claimed is:

1. A stand alone metallic negative electrode, comprising:
   an alkali metal layer having a first surface; and
   a chemical protective layer coating the first surface, which protective layer comprises an alkali or alkaline earth metal carbonate.

2. The electrode of claim 1, wherein the metal layer comprises an alkali metal selected from the group consisting of lithium, sodium and potassium and alloys thereof.

3. The electrode of claim 1, wherein the protective layer is an alkali metal carbonate.

4. The electrode of claim 1, further comprising an electronically conductive backing intimately contacting a second surface of said metal layer which is opposite the first surface of the metal layer.

5. The electrode of claim 4, wherein the backing is a current collector.

6. The electrode of claim 5, wherein the current collector is copper.

7. The electrode of claim 4, further comprising a layer of solid electrolyte intimately contacting the surface of said protective layer on the metal layer.

8. The electrode of claim 7, wherein said solid electrolyte is a solid polymer electrolyte.

9. The electrode of claim 7, wherein said solid electrolyte is an inorganic solid electrolyte.

10. The electrode of claim 9, wherein said inorganic solid electrolyte comprises an ionically conductive glass.

11. The electrode of claim 10, wherein said ionically conductive glass comprises a material selected from the group consisting of phosphorus-based glass, oxide-based glass, sulfur-based glass, oxide/sulfide based glass, selenide based glass, gallium based glass, germanium based glass, and glass-ceramic active metal ion conductors, sodium beta-alumina and lithium beta-alumina.

12. The electrode of claim 11, wherein the ionically conductive glass comprises a material selected from the group consisting of lithium phosphorus oxynitride (LiPON), $Li_3PO_4.Li_2S.SiS_2$, $Li_2S.GeS_2.Ga_2S_3$ and $Li_{1-x-y}Al_xTi_{2-x}Si_yP_{3-y}O_{12}$, LISICON, NASICON, sodium and lithium beta-alumina.

13. The electrode of claim 1, wherein the metal layer comprises lithium or a lithium alloy.

14. The electrode of claim 13, wherein the protective layer comprises lithium carbonate.

15. The electrode of claim 13, further comprising a copper current collector intimately contacting a second surface of said lithium metal layer which is opposite the first surface of the lithium metal later.

16. The electrode of claim 15, further comprising a layer of solid electrolyte intimately contacting the surface of said protective layer on the lithium metal later.

17. The electrode of claim 16, wherein said solid electrolyte is a solid polymer electrolyte.

18. The electrode of claim 16, wherein said solid electrolyte is an inorganic solid electrolyte.

19. The electrode of claim 18, wherein said inorganic solid electrolyte comprises an ionically conductive glass.

20. The electrode of claim 19, wherein said ionically conductive glass comprises a material selected from the group consisting of phosphorus-based glass, oxide-based glass, sulfur-based glass, oxide/sulfide based glass, selenide based glass, gallium based glass, germanium based glass, and glass-ceramic active metal ion conductors, sodium beta-alumina and lithium beta-alumina.

21. The electrode of claim 20, wherein the ionically conductive glass comprises a material selected from the group consisting of lithium phosphorus oxynitride (LiPON), $Li_3PO_4.Li_2S.SiS_2$, $Li_2S.GeS_2.Ga_2S_3$ and $Li_{1-x-y}Al_xTi_{2-x}Si_yP_{3-y}O_{12}$, LISICON, NASICON, sodium and lithium beta-alumina.

22. A method of providing a chemical protective layer on a metal, comprising:
   introducing an alkali metal into a reaction chamber;
   introducing one or more precursors of the protective layer into the reaction chamber and into contact with a first surface of the metal; and
   conducting a reaction involving the one or more precursors to form the chemical protective layer on the metal;
   wherein the protective layer comprises an alkali or alkaline earth metal carbonate.

23. The method of claim 22, wherein the metal comprises an alkali metal selected from the group consisting of lithium, sodium and potassium and alloys thereof.

24. The method of claim 22, wherein the protective layer is an alkali metal carbonate.

25. The method of claim 22, wherein said one or more precursors are in the gas phase.

26. The method of claim 22, wherein said one or more precursors are in the liquid phase.

27. The method of claim 22, wherein the metal layer comprises lithium or lithium alloy, the protective layer comprises lithium carbonate and the one or more precursors comprise materials selected from the group consisting of gaseous $CO_2$, a mixture of $CO_2$ and $O_2$ and liquid organic carbonates.

28. The method of claim 27, wherein said one or more precursors are in the gas phase.

29. The method of claim 28, wherein said one or more precursors consists essentially of $CO_2$.

30. The method of claim 27, wherein said one or more precursors are in the liquid phase.

31. The method of claim 30, wherein the liquid organic carbonates are one or more alkyl carbonates.

32. The method of claim 31, wherein the one or more alkyl carbonates are selected from the group consisting of propylene carbonate, ethylene carbonate, dimethyl carbonate, diethyl carbonate and ethyl methyl carbonate.

33. The method of claim 22, further comprising depositing an ionically conductive protective inorganic glass on the protective layer.

34. The method of claim 33, wherein the ionically conductive protective inorganic glass is selected from the group consisting of phosphorus-based glass, oxide-based glass, sulfur-based glass, oxide/sulfide based glass, selenide based glass, gallium based glass, germanium based glass, and glass-ceramic active metal ion conductors, sodium beta-alumina or lithium beta-alumina.

35. The method of claim 34, wherein the ionically conductive protective inorganic glass is selected from the group consisting of lithium phosphorus oxynitride (LiPON), $Li_3PO_4.Li_2S.SiS_2$, $Li_2S.GeS_2.Ga_2S_3$ and $Li_{1-x-y}Al_xTi_{2-x}Si_yP_{3-y}O_{12}$, LISICON, NASICON, sodium and lithium beta-alumina.

36. The method of claim 34, wherein the ionically conductive protective inorganic glass is lithium phosphorus oxynitride (LiPON).

37. The method of claim 36, wherein the deposition is conducted by one of direct evaporation, physical vapor deposition or chemical vapor deposition.

38. The method of claim 22, further comprising depositing a polymer electrolyte on the protective layer.

39. The method of claim 38, wherein the deposition is conducted by direct vapor polymerization of the polymer electrolyte.

40. The method of claim 22, further comprising bonding an electronically conductive backing on a second surface of said metal layer which is opposite the first surface of the metal layer.

41. The method of claim 22, wherein the metal forms at least part of a negative electrode.

42. The method of claim 22, wherein the metal is lithium or a lithium alloy.

43. A method of providing a chemical protective layer on a negative metal electrode, comprising:
   forming and placing in a battery cell package an electrochemical structure comprising,
      a negative electrode comprising an alkali metal,
      a positive electrode,
      a separator disposed between the negative and positive electrodes, and
      current collectors on the negative and positive electrodes;
   introducing a liquid electrolyte or catholyte comprising one or more precursors of a protective layer into the battery cell package and into contact with an exposed surface of the negative metal electrode; and
   conducting a reaction involving the one or more precursors to form the chemical protective layer on the exposed surface of the negative metal electrode;
   wherein the protective layer comprises an alkali or alkaline earth carbonate.

44. The method of claim 43, wherein the metal comprises an alkali metal selected from the group consisting of lithium, sodium and potassium and alloys thereof.

45. The method of claim 43, wherein the protective layer is an alkali metal carbonate.

46. The method of claim 45, wherein said one or more precursors are liquid organic carbonates.

47. The method of claim 46, wherein the one or more precursors are alkyl carbonates selected from the group consisting of propylene carbonate, ethylene carbonate, dimethyl carbonate, diethyl carbonate and ethyl methyl carbonate.

48. The method of claim 43, wherein the precursors are present in the electrolyte or catholyte in an amount of about 5 ppm-30 vol. %.

49. A battery cell, comprising:
   an negative metal electrode a negative electrode comprising an alkali metal and having a protective layer on an electrolyte exposed surface;
   a positive electrode chosen from a sulfur-based positive electrode, a metal oxide based positive electrode, and a metal sulfide based positive electrode;
   an electrolyte disposed between the negative and positive electrodes; and
   current collectors on the negative and positive electrodes;
   wherein the protective layer comprises an alkali or alkaline earth metal carbonate.

50. The battery cell of claim 49, wherein the metal comprises an alkali metal selected from the group consisting of lithium, sodium and potassium and alloys thereof.

51. The battery cell of claim 49, wherein the protective layer is an alkali metal carbonate.

52. The battery cell of claim 49, wherein the metal comprises lithium or a lithium alloy.

53. The battery cell of claim 52, wherein the protective layer comprises an ionically conductive lithium metal salt.

54. The battery cell of claim 49, wherein the protective layer comprises lithium carbonate.

55. The electrode of claim 1, wherein the chemical protective layer has a thickness between about 1 nm and 10 microns.

56. The electrode of claim 1, wherein the chemical protective layer has a thickness between about 10 nm and 1 micron.

57. The electrode of claim 1, wherein the chemical protective layer has a thickness between about 50 nm and 0.1 micron.

58. The method of claim 22, wherein the chemical protective layer has a thickness between about 1 nm and 10 microns.

59. The method of claim 22, wherein the chemical protective layer has a thickness between about 10 nm and 1 micron.

60. The method of claim 22, wherein the chemical protective layer has a thickness between about 50 nm and 0.1 micron.

* * * * *

UNITED STATES PATENT AND TRADEMARK OFFICE
CERTIFICATE OF CORRECTION

PATENT NO. : 6,911,280 B1
DATED : June 28, 2005
INVENTOR(S) : De Jonghe et al.

It is certified that error appears in the above-identified patent and that said Letters Patent is hereby corrected as shown below:

Column 5,
Line 63, "specified embodiments" should be -- specific embodiments --.

Column 17,
Line 50, "earth carbonate" should be -- earth metal carbonate --.

Column 18,
Line 3, "claim 46" should be -- claim 43 --.

Signed and Sealed this

Eighteenth Day of October, 2005

JON W. DUDAS
*Director of the United States Patent and Trademark Office*